United States Patent
Oh

(10) Patent No.: US 9,570,393 B2
(45) Date of Patent: Feb. 14, 2017

(54) NONVOLATILE MEMORY DEVICE AND METHOD FOR FABRICATING THE SAME

(71) Applicant: SK hynix Inc., Icheon-si, Gyeonggi-do (KR)

(72) Inventor: Kwang-Seok Oh, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/989,144

(22) Filed: Jan. 6, 2016

(65) Prior Publication Data

US 2016/0358855 A1    Dec. 8, 2016

(30) Foreign Application Priority Data

Jun. 5, 2015 (KR) ........................ 10-2015-0079727

(51) Int. Cl.
*H01L 23/522* (2006.01)
*H01L 21/768* (2006.01)
*H01L 23/528* (2006.01)

(52) U.S. Cl.
CPC ..... *H01L 23/5283* (2013.01); *H01L 21/76816* (2013.01); *H01L 21/76829* (2013.01); *H01L 21/76897* (2013.01); *H01L 23/5226* (2013.01)

(58) Field of Classification Search
CPC ............ H01L 23/5226; H01L 23/5283; H01L 21/76897; H01L 21/76846; H01L 21/76829

See application file for complete search history.

(56) References Cited

FOREIGN PATENT DOCUMENTS

| KR | 1020110001527 A | 1/2011 |
|----|-----------------|--------|
| KR | 1020120030193 A | 3/2012 |

*Primary Examiner* — Thanh V Pham
(74) *Attorney, Agent, or Firm* — William Park & Associates Ltd.

(57) ABSTRACT

A nonvolatile memory device may include a stair-shaped structure including a first interlayer dielectric layer and a memory cell repeatedly stacked. The nonvolatile memory device may include an etch stop layer and a second interlayer dielectric layer formed over the stair-shaped structure. The nonvolatile memory device may include an isolation layer passing through the stair-shaped structure, the etch stop layer, and the second interlayer dielectric layer. The nonvolatile memory device may include protective layer interposed between the isolation layer and the etch stop layer, and the protective layer interposed between the isolation layer and the second interlayer dielectric layer. The nonvolatile memory device may include contact plugs coupled to each memory cell, respectively, by passing through the second interlayer dielectric layer and the etch stop layer.

12 Claims, 5 Drawing Sheets

… (1)

NONVOLATILE MEMORY DEVICE AND METHOD FOR FABRICATING THE SAME

CROSS-REFERENCE TO RELATED APPLICATIONS

The present application claims priority of Korean Patent Application No. 10-2015-0079727, filed on Jun. 5, 2015, which is incorporated herein by reference in its entirety.

BACKGROUND

1. Technical Field

Various examples of embodiments may relate to a semiconductor fabricating technology, and more particularly, to a vertical channel type nonvolatile memory device and a fabricating method thereof.

2. Related Art

A memory device may be classified into either a volatile memory device or a nonvolatile memory device according to whether data is retained when power to the device is interrupted. The volatile memory device is a memory device in which data is lost when power is off or is interrupted to the device, and includes a DRAM, a SRAM and the like. The nonvolatile memory device is a memory device in which stored data is retained although power is off or is interrupted to the device, and includes a flash memory device and the like.

Recently, the degree of integration of a flat type nonvolatile memory device is not sufficient. To improve the degree of integration for a memory device there has been proposed a vertical channel type nonvolatile memory device in which strings are arranged vertically from a substrate. The vertical channel type nonvolatile memory device has a structure in which a lower selection transistor, a plurality of conductive layers, and an upper selection transistor are sequentially stacked on the substrate. This structure improves the degree of integration of a memory device through the strings arranged vertically from the substrate.

DETAILED DESCRIPTION

Figure 1:
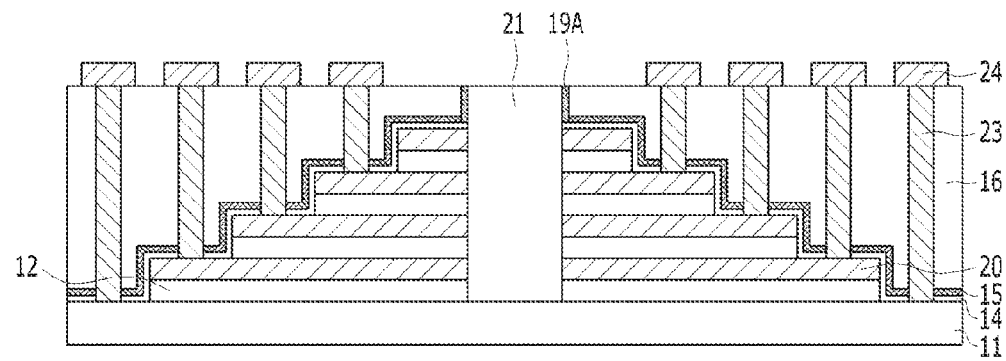
FIG. 1 is a sectional view illustrating a representation of an example of a nonvolatile memory device in accordance with an embodiment.

Various embodiments may be directed to a nonvolatile memory device capable of substantially preventing a short-circuit with a lower memory cell when contacts are formed in memory cells having a stair-shaped stepped portion and a fabricating method thereof.

In an embodiment, a nonvolatile memory device may be provided. The nonvolatile memory device may include a stair-shaped structure including a first interlayer dielectric layer and a memory cell repeatedly stacked. The nonvolatile memory device may include an etch stop layer and a second interlayer dielectric layer formed over the stair-shaped structure. The nonvolatile memory device may include an isolation layer passing through the stair-shaped structure, the etch stop layer, and the second interlayer dielectric layer. The nonvolatile memory device may include protective layer interposed between the isolation layer and the etch stop layer, and the protective layer interposed between the isolation layer and the second interlayer dielectric layer. The nonvolatile memory device may include contact plugs coupled to each memory cell, respectively, by passing through the second interlayer dielectric layer and the etch stop layer.

In accordance with a nonvolatile memory device and a fabricating method thereof according to an embodiment, an etch stop layer may be formed on stair-shaped memory cells to substantially prevent over-etching of the memory cells, so that it may be possible to substantially prevent a short-circuit with a lower memory cell.

Various embodiments will be described below with reference to the accompanying drawings. The present embodiments may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a sectional view illustrating a representation of an example of a nonvolatile memory device in accordance with an embodiment.

Referring to FIG. 1, in the nonvolatile memory device, a stair-shaped thin film structure in which a first interlayer dielectric layer 12 and a memory cell 20 are repeatedly stacked may be formed on a substrate 11 in, for example, a stair-shaped structure. In an embodiment, the interlayer dielectric layers 12 and memory cells 20 may be alternately layered to from a alternately stacked structure shaped like the stair-shaped structure illustrated in FIG. 1. On the thin film structure, a capping layer 14 and an etch stop layer 15 may be formed along a stepped portion. The etch stop layer 15 may play a role of substantially preventing over-etching of an upper memory cell 20 when contact plugs 23 are formed, thereby substantially preventing a possible short-circuit with a lower memory cell.

A second interlayer dielectric layer 16 may be formed on the etch stop layer 15 to bury a thin film structure. The contact plugs 23 may be formed to pass through the second interlayer dielectric layer 16 and the etch stop layer 15 to be coupled to each memory cell 20 and a metal interconnection 24 may be formed to contact with the contact plugs 23.

An active pattern (not illustrated) coupled to the substrate 11 by passing through the thin film structure and an isolation layer 21 for isolating the horizontally adjacent memory cells 20 from one another may be formed. At an upper portion of the isolation layer 21, a protective layer 19A may be formed at sidewalls of the second interlayer dielectric layer 16 and the etch stop layer 15. The protective layer 19A may play a role of substantially preventing damage of the etch stop layer 15 in a sacrificial layer removal step for the formation of the memory cells 20.

FIG. 2a to FIG. 2k are sectional views illustrating a representation of an example of a method for fabricating the nonvolatile memory device in accordance with an embodiment.

Figure 2A:
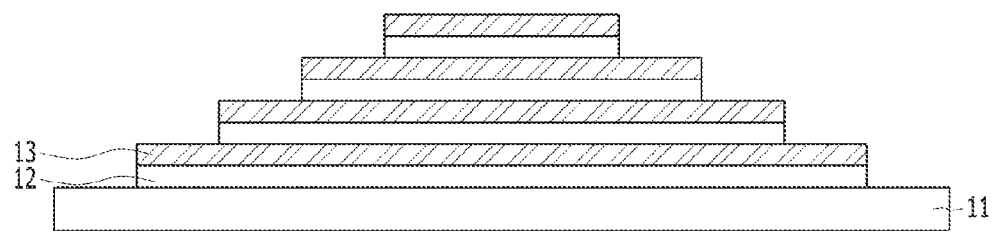
FIG. 2a to FIG. 2k are sectional views illustrating a representation of an example of a method for fabricating a nonvolatile memory device in accordance with an embodiment.

Referring to FIG. 2a, the thin film structure, in which the first interlayer dielectric layer 12 and a sacrificial layer 13 are repeatedly stacked in a stair-shaped structure, may be formed on the substrate 11.

The substrate 11 may include a semiconductor substrate in which a required lower structure such as a lower selection transistor has been formed.

The first interlayer dielectric layer 12 may isolate memory cells to be formed through a subsequent step from one another. The first interlayer dielectric layer 12, for example, may include oxide.

The sacrificial layer 13 may include a material having etching selectivity relative to the first interlayer dielectric layer 12. For example, the sacrificial layer 13 may include a material having wet etching selectivity relative to the first interlayer dielectric layer 12. The sacrificial layer 13 may include a material which may be easily removed through wet etching. The sacrificial layer 13, for example, may include nitride.

Figure 2B:
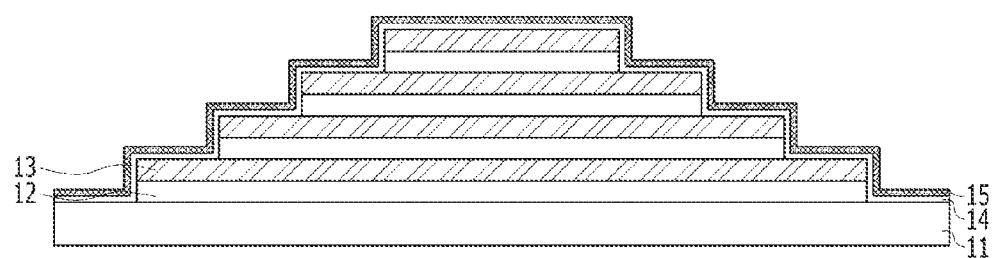

Referring to FIG. 2b, the capping layer 14 and the etch stop layer 15 may be formed along a stepped structure of the thin film structure. The capping layer 14 defines an area where subsequent memory cells are to be formed, and may include a material having etching selectivity relative to the sacrificial layer 13. The capping layer 14, for example, may include oxide.

The etch stop layer 15 may include a material having etching selectivity relative to a second interlayer dielectric layer and memory cells to be formed through a subsequent step. The etch stop layer 15 may play a role of substantially preventing over-etching of an upper memory cell by the stepped portion when a subsequent contact hole is formed. The etch stop layer 15 may include an insulating material. For example, the etch stop layer 15 may include nitride. The etch stop layer 15 may be formed through a deposition method having excellent step coverage in order to have uniform thickness along the stair-shaped stepped portion. The etch stop layer 15, for example, may be formed through ALD (Atomic Layer Deposition) and the like; however, the present embodiments are not limited thereto.

Although not illustrated in the drawing, a step of forming an active pattern (not illustrated) coupled to the substrate by passing through the thin film structure may be performed.

Figure 2C:
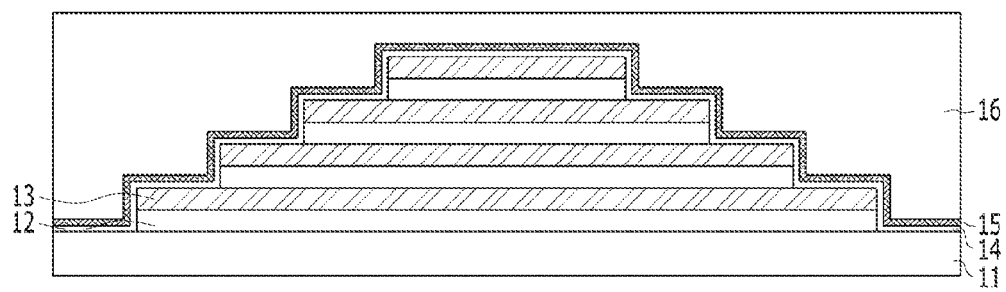

Referring to FIG. 2c, the second interlayer dielectric layer 16 may be formed to bury the uppermost layer of the thin film structure. The second interlayer dielectric layer 16 may serve as interlayer dielectric between the memory cells and an upper metal interconnection to be formed through a subsequent step. The second interlayer dielectric layer 16 may include a material having etching selectivity relative to the etch stop layer 15 and the first interlayer dielectric layer 12. For example, the second interlayer dielectric layer 16 may include a material having dry etching selectivity relative to the first interlayer dielectric layer 12. The second interlayer dielectric layer 16, for example, may include oxide.

Figure 2D:
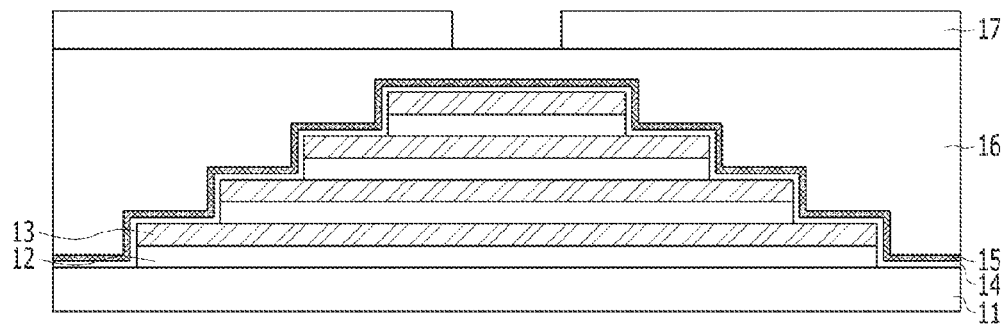

Referring to FIG. 2d, a mask pattern 17 may be formed on the second interlayer dielectric layer 16. The mask pattern 17 may be formed by coating a photoresist layer on the second interlayer dielectric layer 16 and patterning the photoresist layer such that a contact hole target area is opened through exposure and development.

Figure 2E:
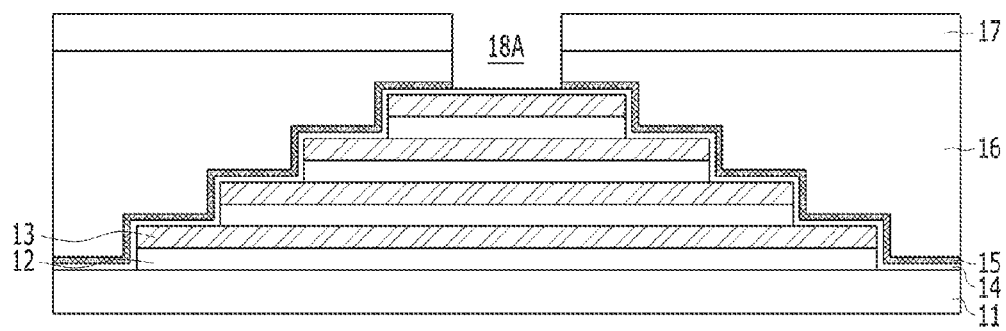

Referring to FIG. 2e, the second interlayer dielectric layer 16 and the etch stop layer 15 are etched using the mask pattern 17 as an etching barrier, thereby forming a groove 18A. The etching step for forming the groove 18A may be divided into a first etching step for etching the second interlayer dielectric layer 16 and a second etching step for etching the etch stop layer 15. For example, the etching step may be divided into the first etching step for etching oxide and the second etching step for etching nitride.

Figure 2F:
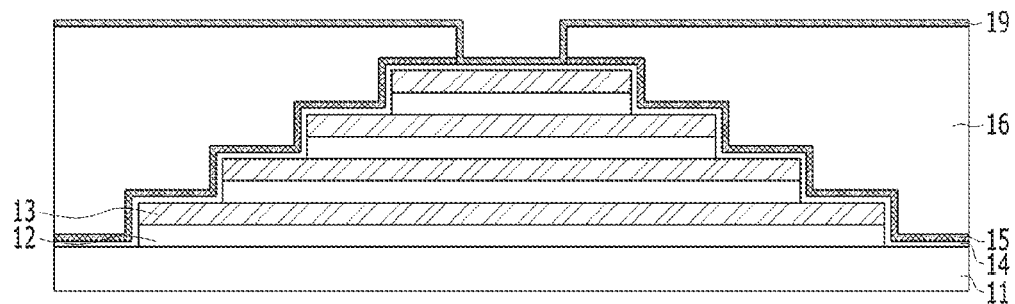

Referring to FIG. 2f, the mask pattern 17 may be removed. When the mask pattern 17 includes the photoresist layer, the mask pattern 17 may be removed through dry etching of an oxygen strip step and the like.

An insulating material 19 may be formed over an entire structure including the groove 18A. The insulating material 19 may serve as a protective layer for substantially preventing the etch stop layer 15 from being damaged when the sacrificial layer 13 is removed in a subsequent step. The insulating material 19 may include a material having etching selectivity relative to the sacrificial layer 13 and the etch stop layer 15. For example, the insulating material 19 may include a material having wet etching selectivity relative to the sacrificial layer 13 and the etch stop layer 15. For example, the insulating material 19 may include oxide.

Figure 2G:
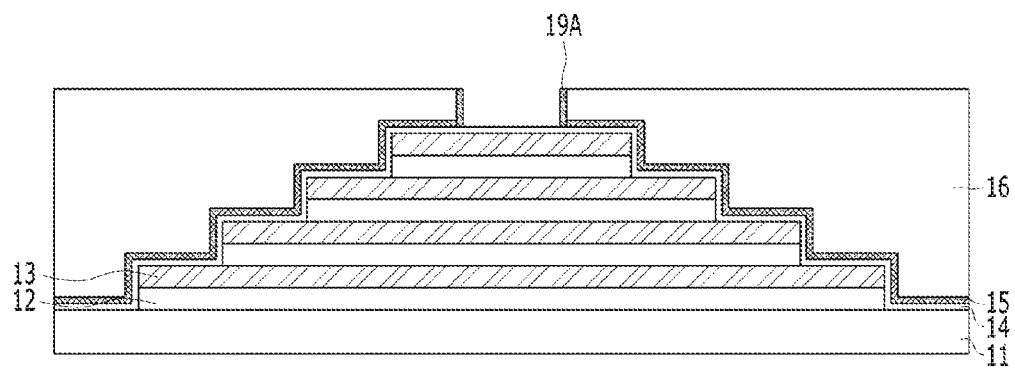

Referring to FIG. 2g, the insulating material 19 (see FIG. 2f) may be etched to remain on a sidewall of the groove 18A (see FIG. 2E). The insulating material 19 may be etched through a spacer etch step.

As described above, the insulating material remaining on the sidewall of the groove 18A, in for example, the sidewalls of the second interlayer dielectric layer 16 and the etch stop layer 15, will be hereinafter referred to as a protective layer 19A.

Figure 2H:
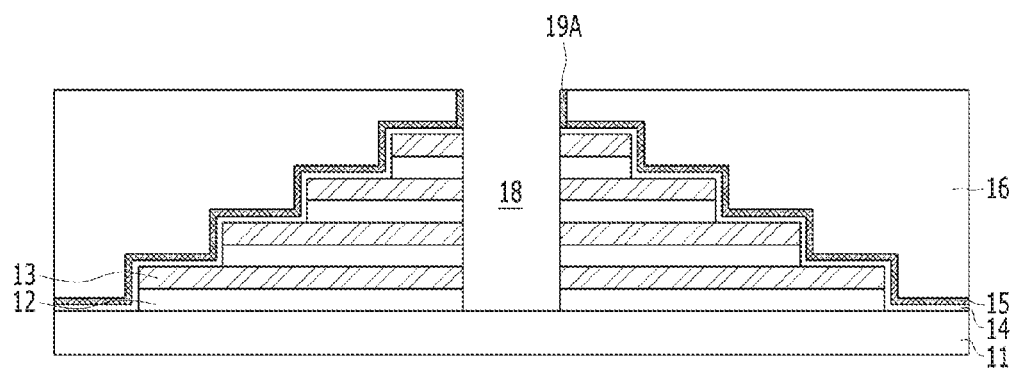

Referring to FIG. 2h, a bottom portion of the groove 18A (see FIG. 2g) exposed by etching the protective layer 19A, that is, the thin film structure may be etched to form a first contact hole 18 through which the substrate 11 is exposed. A mask pattern (not illustrated) for forming the first contact hole 18 may be formed on the second interlayer dielectric layer 16.

Figure 2I:
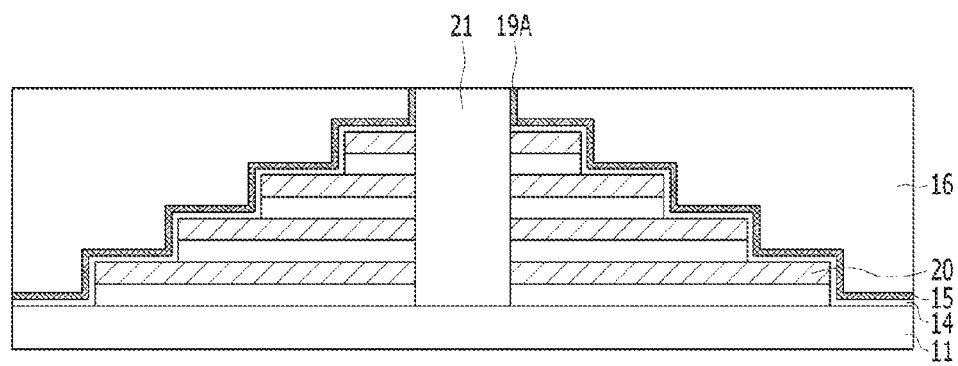

Referring to FIG. 2i, the sacrificial layer 13 (see FIG. 2h) may be removed. The sacrificial layer 13 may be removed by wet etching, and the etch stop layer 15 may be substantially maintained as is by the protective layer 19A formed at the sidewall thereof without being damaged.

Then, the memory cells 20 may be formed by filling a conductive material in an area from which the sacrificial layer 13 has been removed. The memory cell 20, for example, may include a metal material. The memory cell 20, for example, may include a tungsten layer. Accordingly, the thin film structure, in which the first interlayer dielectric layers 12 and the memory cells 20 have been stacked in a stair-shaped structure, may be formed.

The isolation layer 21 may be formed to fill the first contact hole 18. The isolation layer 21 may play a role of isolating the horizontally adjacent memory cells from one another. The isolation layer 21, for example, may include an insulating material. The isolation layer 21, for example, may include oxide.

Figure 2J:
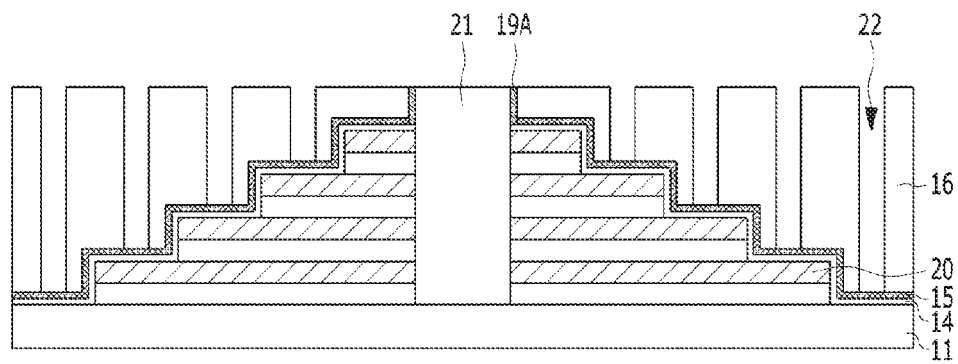

Referring to FIG. 2j, a second contact hole 22 may be formed by selectively etching the second interlayer dielectric layer 16. The second contact hole 22 may couple a metal connection to be formed through a subsequent step to the memory cells, and a plurality of second contact holes 22 may be formed through a one-time etching step. Although not illustrated in the drawing, a mask pattern (not illustrated), in which a contact hole target area has been defined, may be formed on the second interlayer dielectric layer 16 in order to form the second contact holes 22. As the etching is performed, the upper memory cell 20 firstly opened by the stepped portion is not etched by the etch stop layer 15 having etching selectivity lower than that of the second interlayer dielectric layer 16 and the memory cell 20, so that the upper memory cell 20 is not over-etched or is not damaged.

At the time point at which the plurality of second contact holes 22 have been completely formed, the etch stop layer 15 on the plurality of memory cells 20 is opened, and the memory cell 20 is not opened or is not over-etched because of the etch stop layer 15.

Figure 2K:
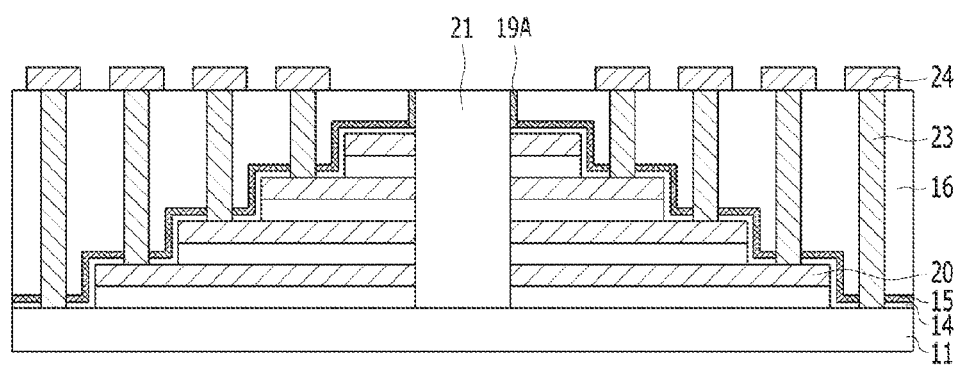

Referring to FIG. 2k, the etch stop layer 15 and the capping layer 14 under the contact holes 22 (see FIG. 2j) are removed to open the memory cells 20. Since the etch stop layer 15 and the capping layer 14 are formed to have substantially the same thickness along the stepped portion, they may be etched without over-etching of the memory cells 20.

Then, the contact plugs 23 may be formed by filling a conductive material in the contact holes 22 to be coupled to the memory cells 20. In an embodiment, the contact plugs 23 may be formed by filling a conductive material in the contact holes 22 to be directly connected to the memory cells 20, respectively.

Then, the metal interconnection 24 may be formed on the second interlayer dielectric layer 16 to contact with each contact plug 23. In an embodiment, the metal interconnections 24 may be formed on the second interlayer dielectric layer 16 to contact with the contact plugs 23, respectively.

As described above, in an embodiment, after the protective layer 19A for protecting the etch stop layer 15 is formed on the sidewall of the etch stop layer 15 in FIG. 2g, the sacrificial layer removal step is performed (i.e., see FIG. 2i), so that it may be possible to substantially prevent the etch stop layer 15 from being damaged. When the second contact holes 22 are formed in FIG. 2j, the over-etching of the memory cells 20 is substantially prevented because of the etch stop layer 15, so that it may also be possible to substantially prevent an electric short-circuit among the memory cells 20 when the contact plugs 23 are formed.

Figure 3:
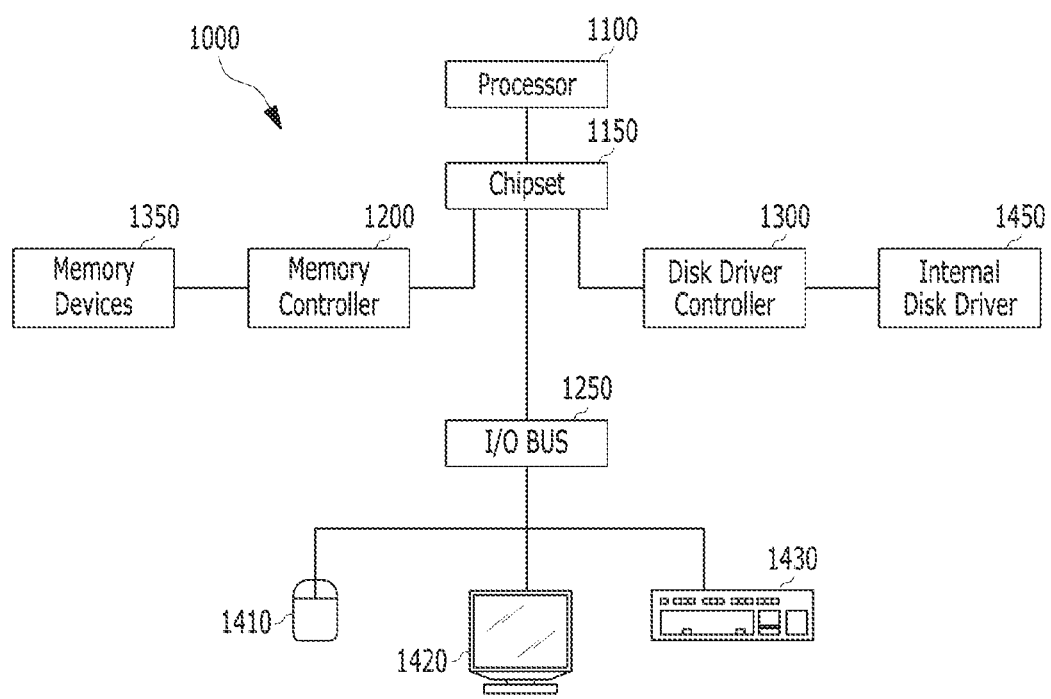
FIG. 3 illustrates a block diagram of an example of a representation of a system employing a nonvolatile memory device and/or method for fabricating the nonvolatile memory device in accordance with the various embodiments discussed above with relation to FIGS. 1-2k.

The nonvolatile memory devices and methods for fabricating the nonvolatile memory devices discussed above (see FIGS. 1-2k) are particular useful in the design of memory devices, processors, and computer systems. For example, referring to FIG. 3, a block diagram of a system employing a nonvolatile memory device and/or method used for fabricating the nonvolatile memory device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one nonvolatile memory device and/or method used for fabricating the nonvolatile memory device as discussed above with reference to FIGS. 1-2k. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one nonvolatile memory device and/or method used for fabricating the nonvolatile memory device as discussed above with relation to FIGS. 1-2k, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 3 is merely one example of a system 1000 employing a nonvolatile memory device and/or method for fabricating the nonvolatile memory device as discussed above with relation to FIGS. 1-2k. In alternate embodiments, such as, for example but not limited to, cellular phones or digital cameras, the components may differ from the embodiments illustrated in FIG. 3.

Although various embodiments have been described for illustrative purposes, it will be apparent to those skilled in the art that various changes and modifications may be made without departing from the spirit and scope of the disclosure as defined in the following claims.

What is claimed is:

1. A nonvolatile memory device comprising:
a stair-shaped structure including a first interlayer dielectric layer and a memory cell repeatedly stacked;
an etch stop layer and a second interlayer dielectric layer formed over the stair-shaped structure;
an isolation layer passing through the stair-shaped structure, the etch stop layer, and the second interlayer dielectric layer;
a protective layer interposed between the isolation layer and the etch stop layer, and the protective layer interposed between the isolation layer and the second interlayer dielectric layer; and
contact plugs coupled to each memory cell, respectively, by passing through the second interlayer dielectric layer and the etch stop layer.

2. The nonvolatile memory device of claim 1, wherein the contact plugs are directly connected to each memory cell, respectively, by passing through the second interlayer dielectric layer and the etch stop layer.

3. The nonvolatile memory device of claim 1, wherein the protective layer is formed on a sidewall of the etch stop layer.

4. The nonvolatile memory device of claim 1, wherein the first interlayer dielectric layers and a memory cells are alternately stacked.

5. The nonvolatile memory device of claim 1, wherein the protective layer includes a material having etching selectivity relative to the etch stop layer.

6. The nonvolatile memory device of claim 1, wherein the etch stop layer includes a material having etching selectivity relative to the first and second interlayer dielectric layers.

7. The nonvolatile memory device of claim 1, further comprising:
metal interconnections formed over the second interlayer dielectric layer to contact with the contact plugs, respectively.

8. The nonvolatile memory device of claim 1, wherein the memory cell includes a metal material.

9. The nonvolatile memory device of claim 1, wherein the memory cell includes a tungsten layer.

10. The nonvolatile memory device of claim 1, wherein the first and second interlayer dielectric layers include oxide.

11. The nonvolatile memory device of claim 1, wherein the first and second interlayer dielectric layers include a material having etching selectivity.

12. The nonvolatile memory device of claim 1, wherein the etch stop layer includes nitride.

* * * * *